US009070730B2

(12) United States Patent
Fairhurst et al.

(10) Patent No.: US 9,070,730 B2
(45) Date of Patent: Jun. 30, 2015

(54) METHOD AND APPARATUS FOR REMOVING A VERTICALLY-ORIENTED SUBSTRATE FROM A CASSETTE

(75) Inventors: John Robert Fairhurst, Plaistow, NH (US); Jeffrey E. Krampert, Topsfield, MA (US); Richard J. Hertel, Boxford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 354 days.

(21) Appl. No.: 13/268,109

(22) Filed: Oct. 7, 2011

(65) Prior Publication Data

US 2013/0089395 A1    Apr. 11, 2013

(51) Int. Cl.
*H01L 21/677* (2006.01)
*H01L 21/687* (2006.01)

(52) U.S. Cl.
CPC ....... *H01L 21/68707* (2013.01); *Y10S 414/141* (2013.01); *Y10S 414/138* (2013.01); *H01L 21/67751* (2013.01)

(58) Field of Classification Search
USPC .................... 414/416.09, 938, 941, 811, 908; 294/103.1, 213
See application file for complete search history.

(56) References Cited

U.S. PATENT DOCUMENTS

| 4,735,540 | A | * | 4/1988 | Allen et al. | 414/222.04 |
|---|---|---|---|---|---|
| 4,875,824 | A | * | 10/1989 | Moe et al. | 294/103.1 |
| 4,892,451 | A | * | 1/1990 | Mahler | 414/217 |
| 5,468,111 | A | * | 11/1995 | Flint et al. | 414/416.08 |
| 5,543,022 | A | * | 8/1996 | Nguyen et al. | 204/298.15 |
| 5,934,865 | A | * | 8/1999 | Meadows | 414/796.9 |
| 5,936,931 | A | * | 8/1999 | Kobayashi et al. | 294/103.1 |
| 5,938,902 | A | * | 8/1999 | Nguyen et al. | 204/298.15 |
| 6,030,455 | A | * | 2/2000 | Nozawa et al. | 118/500 |
| 6,576,065 | B1 | * | 6/2003 | Lamure | 118/503 |
| 6,660,089 | B2 | * | 12/2003 | Nozawa et al. | 118/500 |
| 7,918,488 | B2 | * | 4/2011 | Shiraishi et al. | 294/103.1 |
| 8,770,906 | B2 | * | 7/2014 | Atsumi et al. | 414/225.01 |
| 8,920,107 | B2 | * | 12/2014 | Ikeda et al. | 414/744.1 |
| 2008/0288968 | A1 | * | 11/2008 | Shiraishi et al. | 720/604 |

* cited by examiner

*Primary Examiner* — James Keenan

(57) ABSTRACT

A system and method are disclosed for removing vertically oriented substrates from a cassette. A lifter includes a lifter notch and a stabilizer notch for holding a substrate. The lifter notch engages and lifts the substrate along the substrate ID, while the stabilizer notch captures the substrate OD to prevent lateral movement of the substrate during lifting. In use, the cassette is tilted to bias all substrates to one side and ensure consistent spacing. The lifter moves up into the cassette until the notches are adjacent, but beneath, the ID and OD of a substrate. The lifter is moved laterally to position the notches directly below the ID and OD. Upward movement of the lifter causes the lifter notch to lift the substrate along the ID. The lifter continues upward with the substrate until the substrate clears the top of the cassette. Other embodiments are described and claimed.

16 Claims, 17 Drawing Sheets

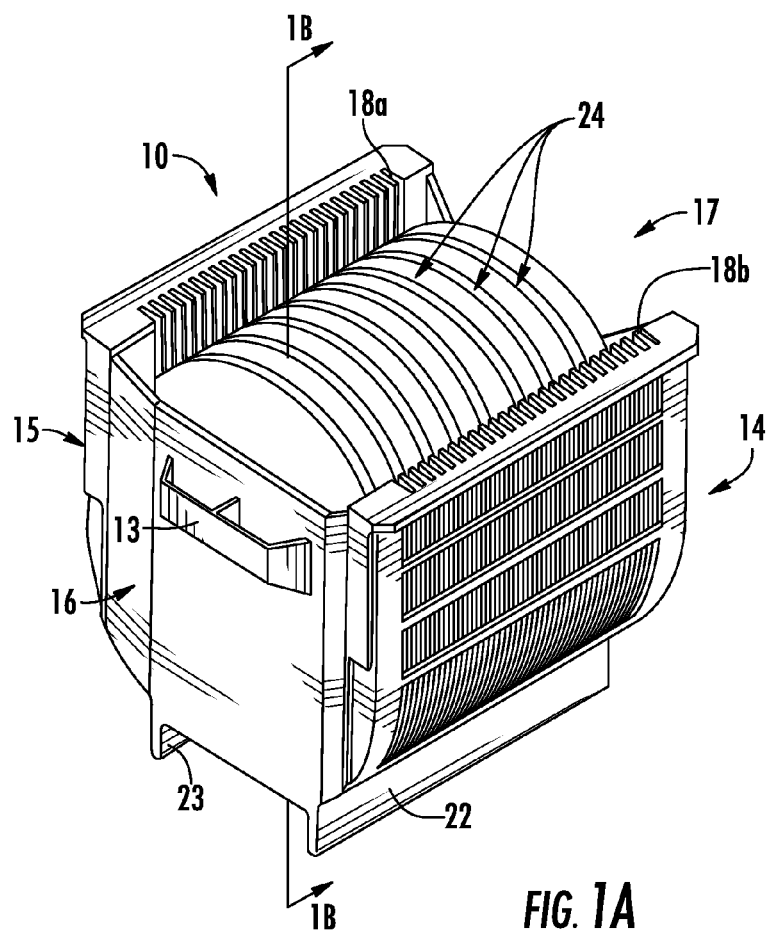
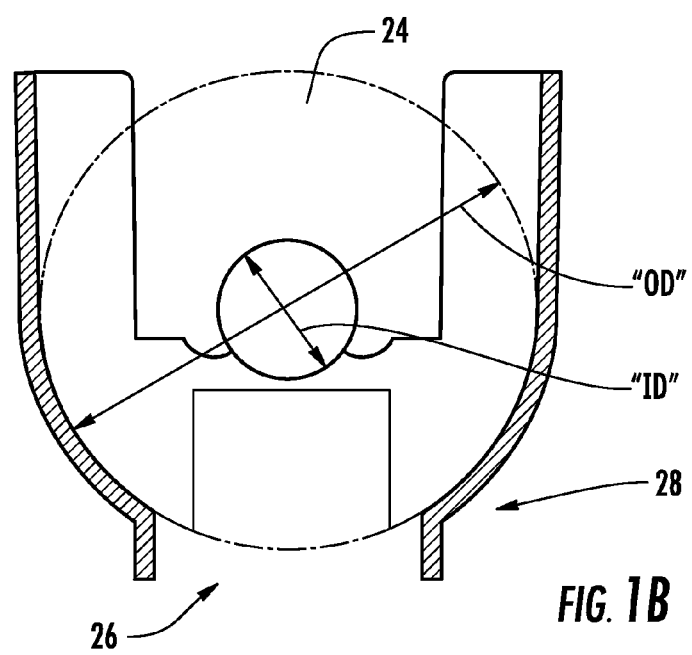

METHOD AND APPARATUS FOR REMOVING A VERTICALLY-ORIENTED SUBSTRATE FROM A CASSETTE

BACKGROUND OF THE INVENTION

1. Field of the Invention

Embodiments of the present disclosure relate to the field of device manufacturing. More particularly, the present disclosure relates to an improved method and apparatus for removing vertically oriented substrates from cassettes.

2. Discussion of Related Art

Attempts have been made to automate the handling and transfer of thin substrates during ion implantation, sputter coating and other processes both for preventing contamination, abrasion or damage to the substrates and for achieving a high throughput in terms of the number of substrates processed per unit time. Often, substrate cassettes are provided to hold a plurality of discs in vertically facing alignment.

The cassette can be a generally rectangular frame having a pair of parallel side walls which stand facing each other and are grooved so that standard-sized disk-shaped substrates can be held edgewise. The grooves on the side walls of the cassette are vertical and parallel to each other so that the substrate can be moved into and out of the cassette while maintaining its upright vertical position.

An automated substrate transfer system may be used to remove substrates from the cassette. For example, a movable picker can pass through the cassette to engage a substrate and remove it from the cassette. The substrate can then be transferred to processing chamber where one or more deposition, implantation or other treatment processes can be performed. The substrate may remain engaged with the picker throughout the transfer and processing steps, or it may be transferred to a separate carrier for either or both of the transfer and processing steps. Once processing is complete (or a desired processing step is complete), the picker may return the substrate to the cassette or other carrier, where the processed substrates remain while the movable picker removes a next substrate to be processed. This continues until all the substrates have been processed.

A problem with current substrate transfer arrangements is that the picker typically either engages the outer diameter of the substrate or it contacts the substrate face. If the picker fails to perfectly engage the outer diameter, the substrate can slip off the picker, causing damage. For instances in which the picker is configured to contact the substrate faces (similar to tweezers), the chances that face damage will occur is undesirably increased.

Thus, there is a need for an improved system and method for removing substrates from a cassette. The system and method should provide consistent and reliable engagement of a substrate to minimize the chance for damage to occur to the substrate, either through dropping, through contact with of the substrate face, or through engagement with other substrates.

SUMMARY OF THE INVENTION

The following presents a simplified summary in order to provide a basic understanding of some novel embodiments described herein. This summary is not an extensive overview, and it is not intended to identify key/critical elements or to delineate the scope thereof. Its sole purpose is to present some concepts in a simplified form as a prelude to the more detailed description that is presented later.

A method and apparatus are disclosed for quickly and securely lifting a vertically oriented substrate from a cassette without touching the substrate faces. A substrate lifter is disclosed for lifting a substrate having an outside diameter (OD), an inside diameter (ID), and first and second substrate faces. The substrate lifter may comprise first and second ends, and first and second lifter faces. The first end may comprise substrate engaging features including first and second recesses. The first recess may be positioned adjacent the first end of the lifter and configured to engage the substrate ID for lifting the substrate in a vertical direction. The second recess may be configured to receive the substrate OD for limiting lateral movement of the OD to a predetermined amount. The first and second recesses may include mouth portions oriented toward the first end of the lifter.

A substrate lifter is disclosed for selectively removing a vertically oriented substrate from a substrate cassette, where the vertically oriented substrate includes an ID and an OD. The substrate lifter comprises a substrate engaging end and an adjustment end. The substrate engaging end comprises a lifter notch and a stabilizer notch. The lifter notch can be configured to engage the substrate ID to lift the substrate vertically. The stabilizer notch can have first and second angled notch surfaces. The stabilizer notch can be positioned to contact the substrate OD with the first angled notch surface or the second angled notch surface to prevent a face of the substrate from contacting the substrate lifter. The lifter notch and stabilizer notch may each each include angled notch surfaces oriented toward the engagement end. The substrate lifter may have a thickness defined between front and back lifter surfaces, and a width defined between first and second lifter sides, where the lifter width is smaller than the substrate OD.

A method is disclosed for removing a vertically oriented substrate from a cassette. The method comprises: positioning a lifter having a lifter notch and a stabilizer notch beneath a cassette containing a plurality of vertically oriented substrates, the lifter notch and the stabilizer notch each having first and second angled notch surfaces; engaging the lifter notch with an ID of a targeted substrate of the plurality of vertically oriented substrates; capturing an OD of the targeted substrate with the stabilizer notch such that the OD contacts only the first angled stabilizer notch surface or the second angled stabilizer notch surface; and moving the lifter and the substrate in a first direction until the targeted substrate is removed from the cassette.

BRIEF DESCRIPTION OF THE DRAWINGS

For a better understanding of the present disclosure, reference is made to the accompanying drawings, which are incorporated herein by reference and in which:

FIGS. 1A and 1B are perspective and cross-section views, respectively, of an exemplary substrate cassette;

DESCRIPTION OF EMBODIMENTS

Figure 2:
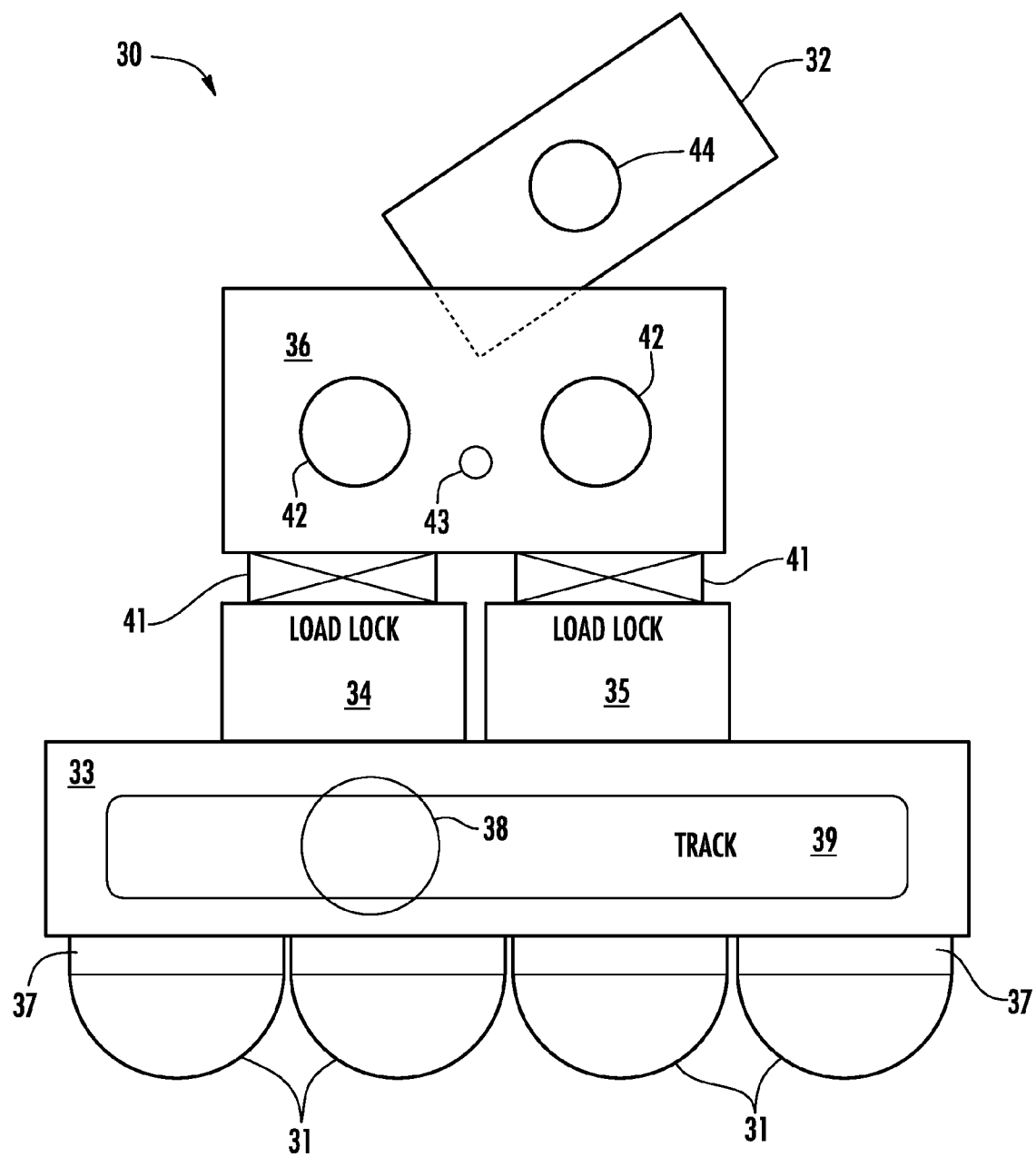
FIG. 2 is a schematic diagram of an exemplary substrate handling system.

FIGS. 1A and 1B show an exemplary substrate cassette 10 containing a plurality of substrates 24. The cassette 10 may include front and back surfaces 16, 17, first and second sidewalls 14, 15, and pairs of left and right dividers 18a, 18b. The four walls define an internal bay portion for receiving the substrates and holding them substantially parallel to each other. The substrate cassette can also includes a pair of parallel legs 22, 23 for supporting the cassette 10, and a handle 13 for facilitating handling of the cassette 10. In the illustrated embodiment the cassette 10 holds the substrates 24 in a substantially vertical orientation. FIG. 1B shows that the cassette 10 has an opening 26 in a bottom portion 28 that enables a substrate handling device to engage the individual substrates 24 through the cassette 10.

The cassette 10 may function to protect the substrates 24 during transport and storage, but the cassette 10 is not typically used to hold the substrates 24 during any of the variety of processing steps to which substrates of the kind are often subjected. For example, the substrates 24 may be subject to one or more ion implantation steps or one or more plasma doping steps. Thus, for such processing, the substrates may be transferred to another holding device, an example of which is often referred to as a front opening unified pod, or "FOUP." The FOUP may be part of a substrate handling system that manipulates the individual substrates and subjects the substrates to one or more processing steps.

FIG. 2 shows an exemplary substrate handling system 30 in which a plurality of FOUPs 31 each hold a plurality of substrates. The substrates are transferred from the FOUPs 31 to a process chamber 32 via a buffer chamber 33, load locks 34 and 35 and a wafer handler chamber 36. Pod doors 37 interface the between the FOUPs 31 and the buffer chamber 33 so that substrates can pass between the FOUPs 31 and buffer chamber 33. In buffer chamber 33, an atmospheric robot 38 transports wafers along a track 39 to move wafers between the FOUPs 31 and load locks 34 and 35. The buffer chamber 33 may be at or near atmospheric pressure, and provides a controlled, low particulate environment. The load locks 34 and 35 communicate with substrate handler chamber 36 through isolation valves 40 and 41, respectively. The substrate handler chamber 36 may include one or more vacuum robots 42 and a substrate alignment station 43. A substrate is transferred by one of the robots 42 from one of the load locks 34, 35 to substrate alignment station 43. The substrate then is transferred to a process station 44 in process chamber 32 for processing, such as by ion implantation. The same process is reversed to transfer the substrate back to one of the FOUPs.

Figure 3:
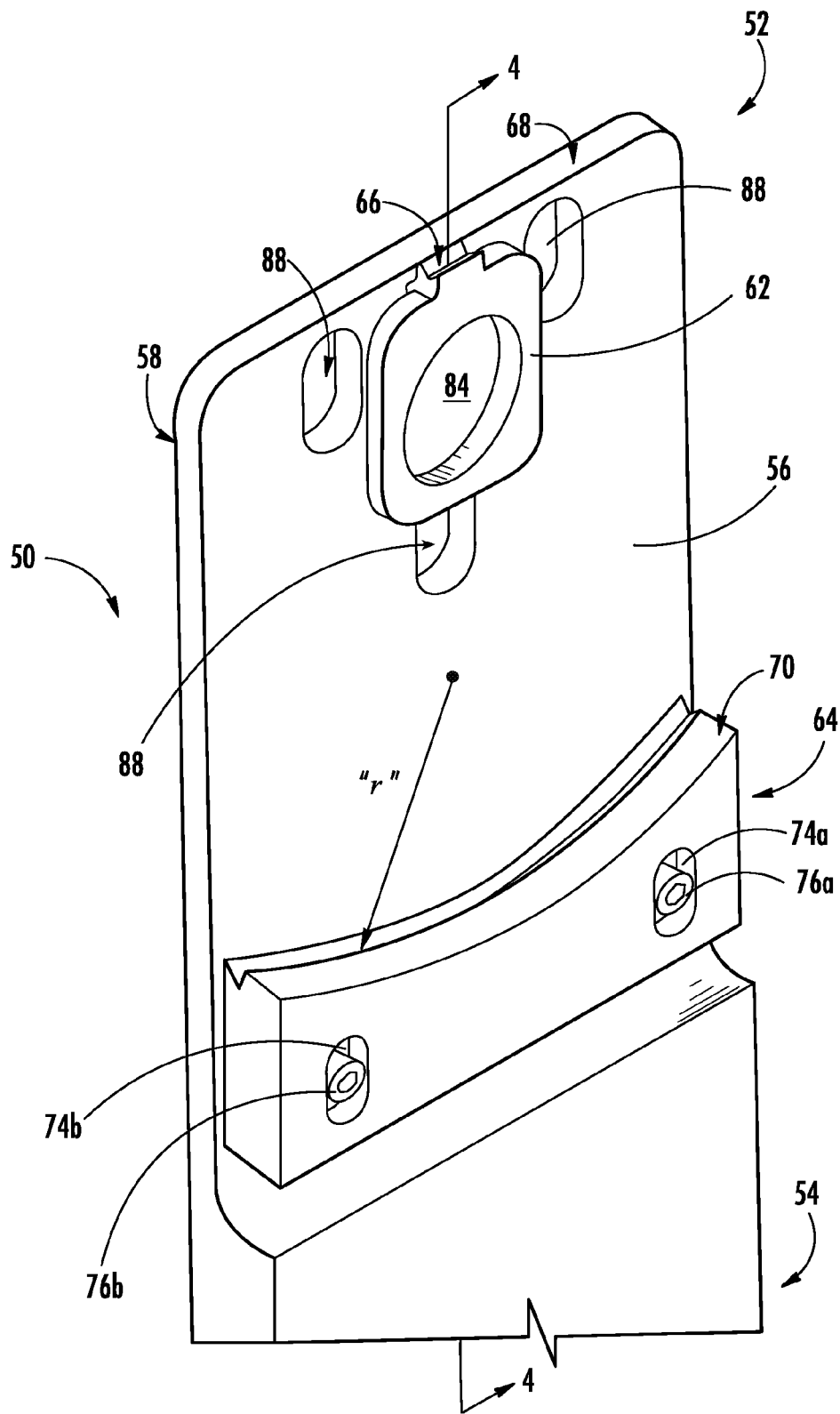
FIG. 3 is a perspective view of an exemplary lifter for use with the cassette and substrate handling system of FIGS. 1A-2.
Figure 7A:
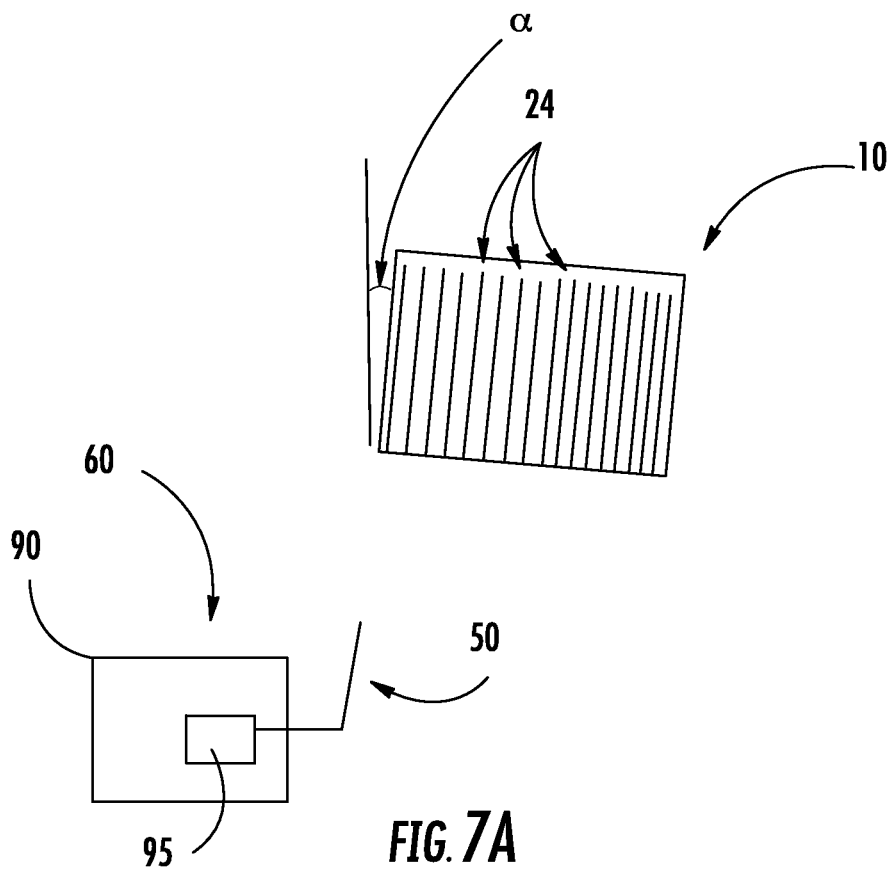
FIGS. 7A through 7E are a series of schematics illustrating an exemplary operation of the disclosed lifter in removing a substrate from a cassette.

As will be appreciated, part of the above noted process includes the transfer of substrates from the cassette 10 to the FOUPs 31 (and back to the cassette after processing is complete, as desired). FIG. 3 shows an exemplary substrate lifter 50 for use in removing individual substrates 24 from a cassette 10. The lifter 50 has first and second ends 52, 54 and generally planar first and second surfaces 56, 58. The first end 52 may be include substrate engaging features while the second end 54 may include features that enable the lifter 50 to be engaged by an adjustment assembly 60 (FIG. 7A). The adjustment assembly can be used to manually or automatically move the lifter 50 as desired with respect to the cassette 10 and a substrate 24. In the illustrated embodiment, the substrate engaging features are disposed on the first surface 56.

The substrate engaging features may include a lifter protrusion 62 and a stabilizer 64 which together can operate to support a substrate 24 to lift it out and away from the cassette 10 in a desired manner. In the described embodiment, the substrate 24 has an outer diameter "OD" and an inner diameter "ID" (see FIG. 1). It will be appreciated that substrates of this type are often used as hard disk drives for computers and other related equipment. The lifter protrusion 62 may be sized to fit within the ID of the substrate 24, and may include a lifter notch 66 positioned adjacent to an upper edge 68 of the first end 52 of the lifter 50. The stabilizer 64 may have an upper surface 70 that assumes an arcuate shape that approximates the shape of the OD of the associated substrate 24. A stabilizer notch 72 is provided in the upper surface 70 of the stabilizer 64. As can be seen, the lifter notch 66 and the stabilizer notch 72 are oriented so that the open "mouths" of the notches face in the same direction (i.e., toward the first end 52 of the lifter 50).

The stabilizer 64 may be positioned a distance "d" away from the lifter protrusion 62. This distance "d" is selected depending upon the size of the substrate 24 being lifted, and ensures that the substrate 24 will be "lifted" by the lifter notch 66 along the ID of the substrate, and "stabilized" by the stabilizer notch 72 along the OD of the substrate. This arrangement ensures secure engagement between the lifter 50 and the substrate 24 while eliminating the chance that the lifter will contact the front or back faces of the substrate.

As noted, the stabilizer 64 may be positioned a distance "d" from the lifter protrusion 62 depending upon the size of the substrate being lifted. In one embodiment, the stabilizer 64 may have adjustment features to enable the distance "d" to be adjusted so that the lifter 50 can be used with a variety of different substrate sizes. To facilitate such adjustment, the stabilizer 64 may include first and second elongated recesses 74a, b for receiving first and second fasteners 76a, b that selectively fix the stabilizer 64 to the first surface 56 of the lifter 50. The fasteners 76a, b are shown as being socket head cap screws, but they could be any of a variety of fasteners. Thus arranged, the fasteners can be loosened and the stabilizer 64 moved to a desired position with respect to the lifter protrusion 62 depending on the size of the substrate to be handled. The fasteners then may then be tightened to lock the stabilizer in the desired position. As will be appreciated, the illustrated adjustment arrangement can be manually performed, or it can be automated. Alternatively, the lifter 50 may be provided with a fixed (i.e., non-adjustable) stabilizer 64 customized for a particular substrate size.

Figure 5:
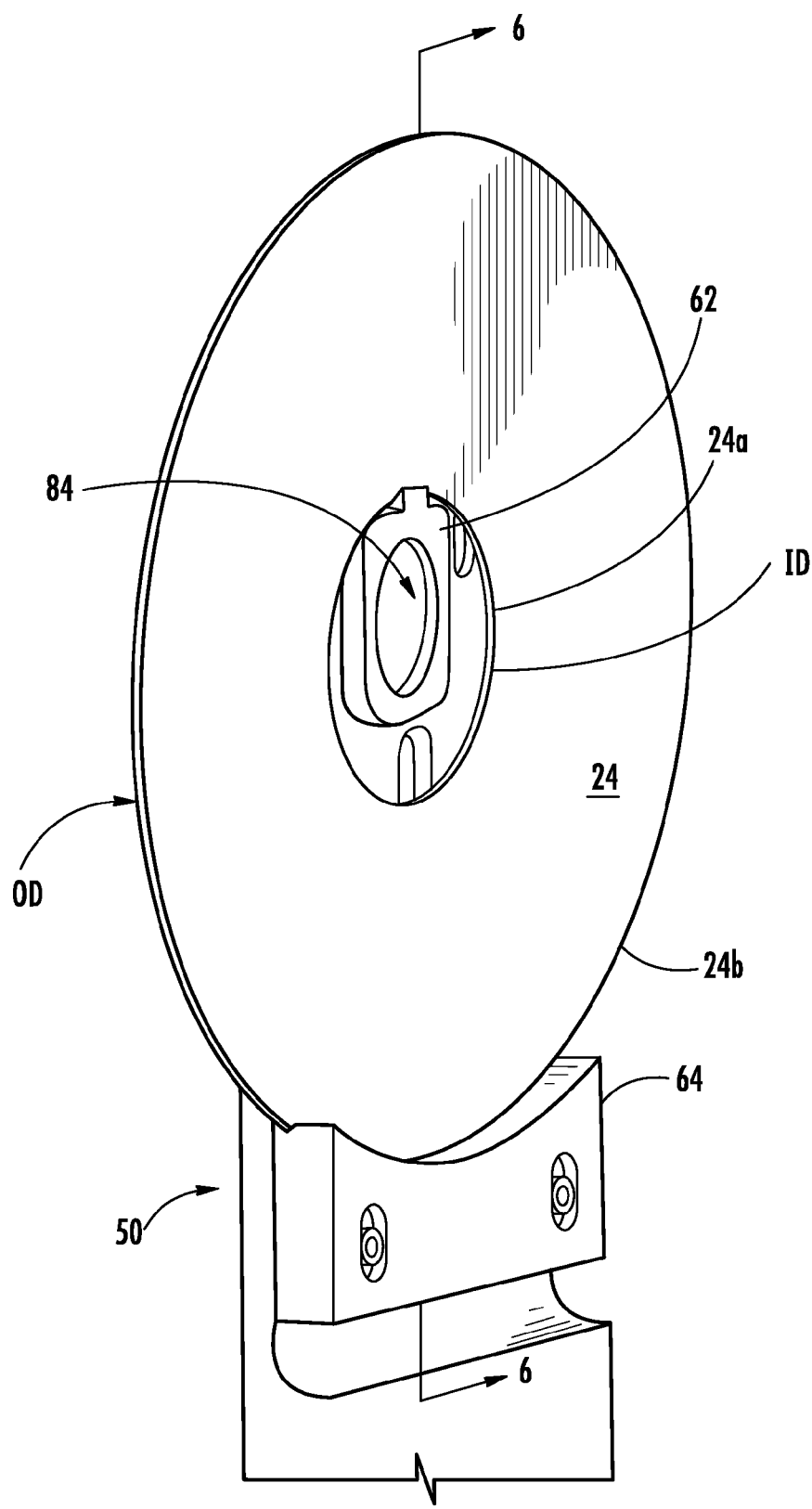
FIG. 5 is a perspective view of the lifter of FIG. 3 engaged with an exemplary substrate.
Figure 6:
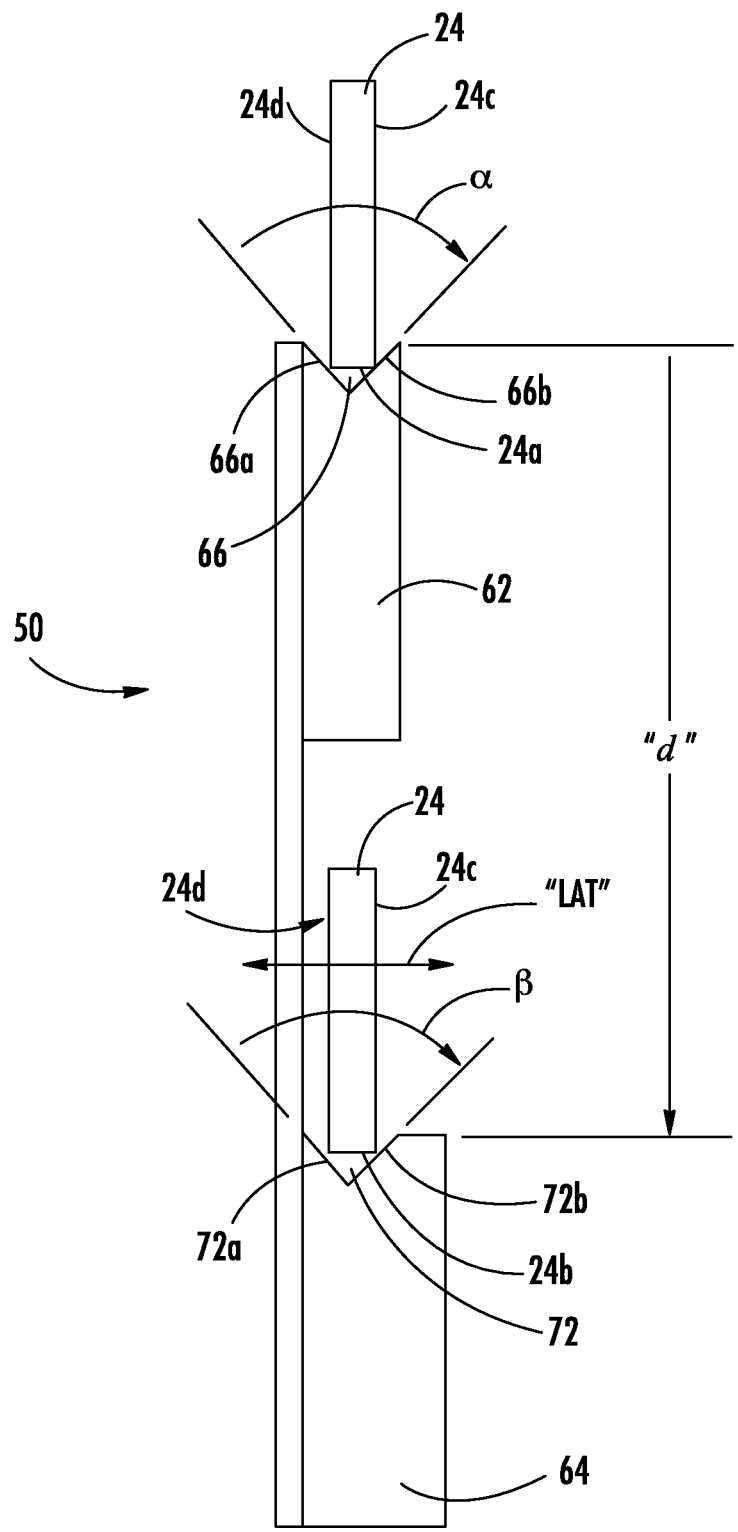
FIG. 6 is a cross-section view of the lifter/substrate interaction of FIG. 5, taken along line 6-6 of FIG. 5.

FIG. 5 shows an exemplary substrate 24 engaged with the lifter 50. As can be seen, the lifter notch 66 of the lifter protrusion 62 engages the inner edge 24a of the substrate along the substrate ID, while the stabilizer notch 72 of the stabilizer 64 contacts an outer edge 24b of the substrate along the substrate OD. This engagement can be seen more clearly with reference to FIG. 6, which shows the interaction between the substrate edges 24a, b and the lifter 50 surfaces in detail. As can be seen, the notches 66, 72 prevent the substrate face 24d closest to the lifter 50 from contacting any surfaces of the lifter. Only the substrate ID and OD edges are used to support the substrate. In particular, FIG. 6 shows that the inner edge 24a of the substrate 24 is supported on the side surfaces 66a, b of the lifter notch 66. In the illustrated embodiment, the substrate 24 is shown with squared corners. It will be appreciated, however, that substrates having inner edges 24a, b that are beveled or rounded will be held in a similar manner within notch 66 so that the front and back surfaces 24c, d will not be contacted by any portion of the lifter 50.

It can be seen that while the lifter notch 66 fully supports the inner edge 24a of the substrate 24, the stabilizer notch 72 merely "captures" the outer edge 24b of the substrate. That is, the stabilizer notch 72 is not relied upon to lift the substrate 24, but rather the stabilizer notch 72 is configured to prevent lateral movement of the outer edge 24b of the substrate (i.e., movement in the direction of arrow "LAT") as the substrate is being lifted from the cassette 10. Limiting lateral movement of the outer edge of the substrate in this manner contains the substrate, preventing the substrate from moving toward the front surface 56 of the lifter, and thus preventing the substrate face 24d from touching the lifter 50. It also prevents the substrate from moving in the opposite direction, away from the lifter 50, which could cause the substrate to separate from the lifter.

As shown, when the substrate 24 is fully engaged with the lifter 50, the substrate outer edge 24b does not engage both side surfaces 72a, b of the stabilizer notch 72. At most, the substrate outer edge 24b may engage one of the side surfaces (depending upon which way the substrate moves).

The aforementioned arrangement of lifter and stabilizer notches allows the lifter 50 to maintain engagement with the substrate 24 when the lifter is tilted by up to 30 degrees with respect to vertical. Larger tilt angles may also be accommodated.

The lifter and stabilizer notches 66, 72 are shown as having approximately the same size and dimension. The lifter notch 66 may have an included angle α between the side surfaces 66a, b, while the stabilizer notch 72 may have an included angle β between the side surfaces 72a, b. In one embodiment, the angles α, β are about 100 degrees, though other angles can be used. In addition, the included angle of the lifter notch can be different from the included angle of the stabilizer notch. It will be appreciated that they could also be provided with different dimensions or profiles, as desired.

Figure 4:
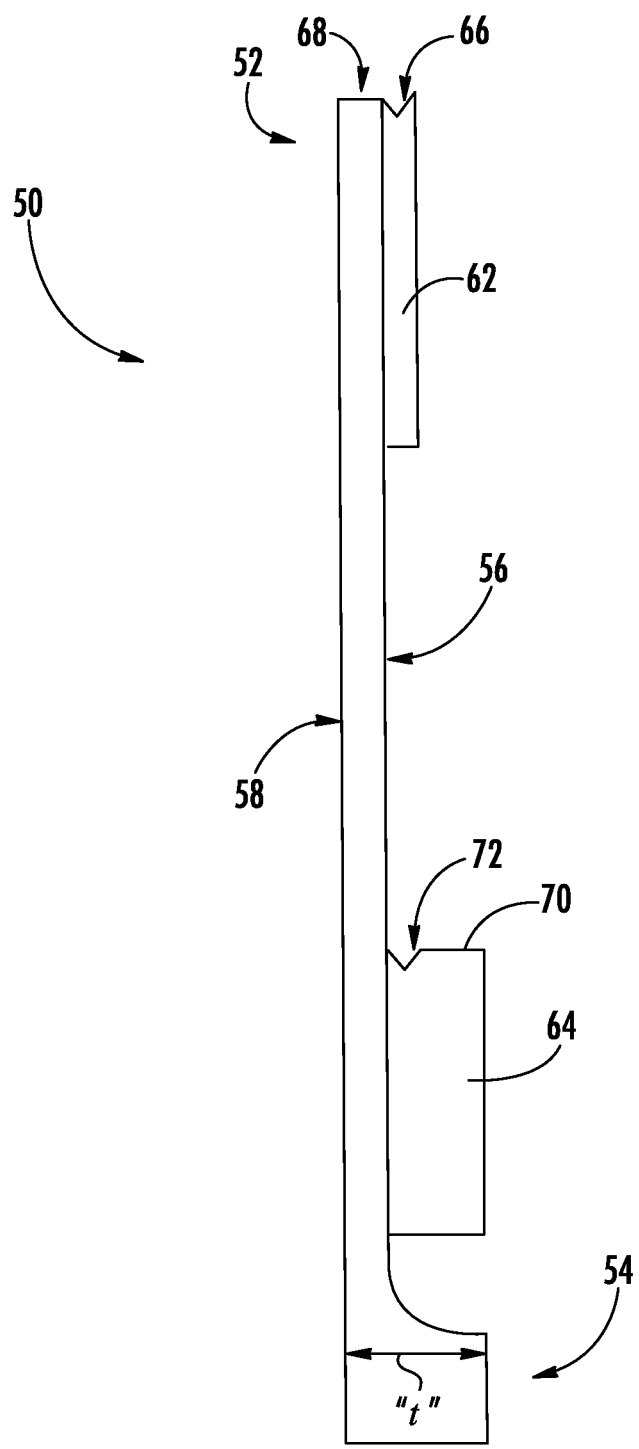
FIG. 4 is a cross-section view of the lifter of FIG. 3 taken along line 4-4 of FIG. 3.

Referring now to FIGS. 7A-7E, a series of steps are shown in which the disclosed lifter 50 can be used to remove a substrate 24 from a cassette 10. In FIG. 7A, the cassette 10 and lifter 10 are positioned adjacent each other. The cassette 10 holds a plurality of substrates 24 in a vertically oriented position (though, for simplicity, only two are shown). The cassette 10 is tilted by an angle α so that the substrates 24 are not vertical, but rather are tilted slightly. In one exemplary embodiment the tilt angle α is about 1-degree to about 5-degrees. Tilting the cassette 10 by this small amount ensures that all of the substrates 24 in the cassette 10 are biased to one side, ensuring all of the substrates are evenly spaced. This may be important to ensure that the lifter 50, which will be moved between the substrates, does not touch the face of any of the substrates. In one embodiment, the substrates are spaced apart by about ¼-inch (gap "g" in FIG. 7B). Thus, the thickness "t" (FIG. 4) of the thickest portion of the lifter 50 in such an embodiment is less than ¼-inch to enable the lifter to move between adjacent substrates without touching the substrate faces.

Figure 7B:
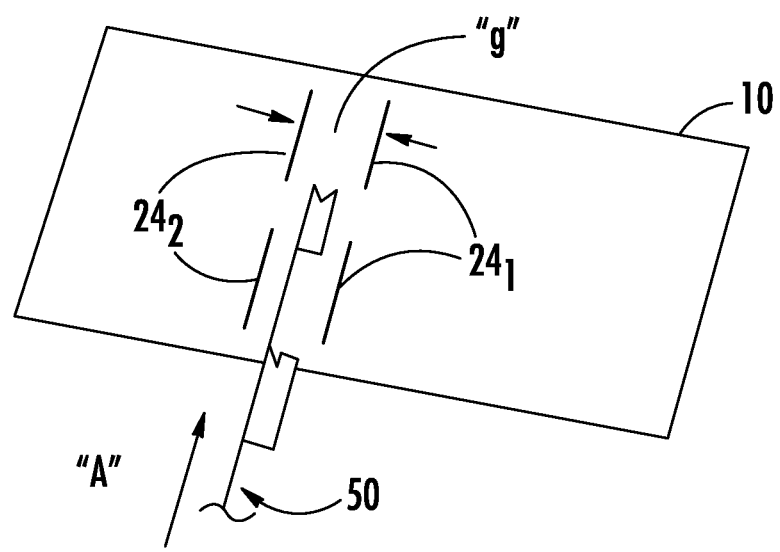
Figure 7C:
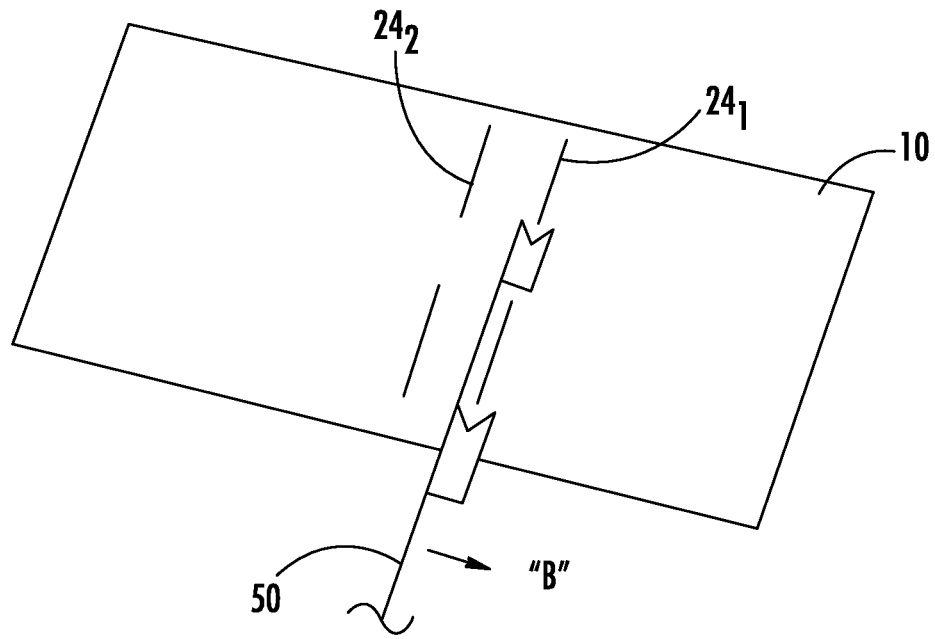

The lifter 50 is tilted by the same angle α prior to positioning it between substrates 24. FIG. 7B shows the lifter 50 moved upward in the direction of angle α (i.e., the direction of arrow "A") between a pair of substrates $24_1$, $24_2$. As previously noted, the movement of lifter 50 can be manual, or it can be automatic. Where movement is automatically controlled, the lifter 50 can be coupled to an adjustment assembly 60 that includes an automated adjustment controller 90. The automated adjustment controller 90 may include one or more adjustment mechanisms 95, such as servo motors or stepper motors, to enable precise movement of the lifter 50.

Figure 7D:
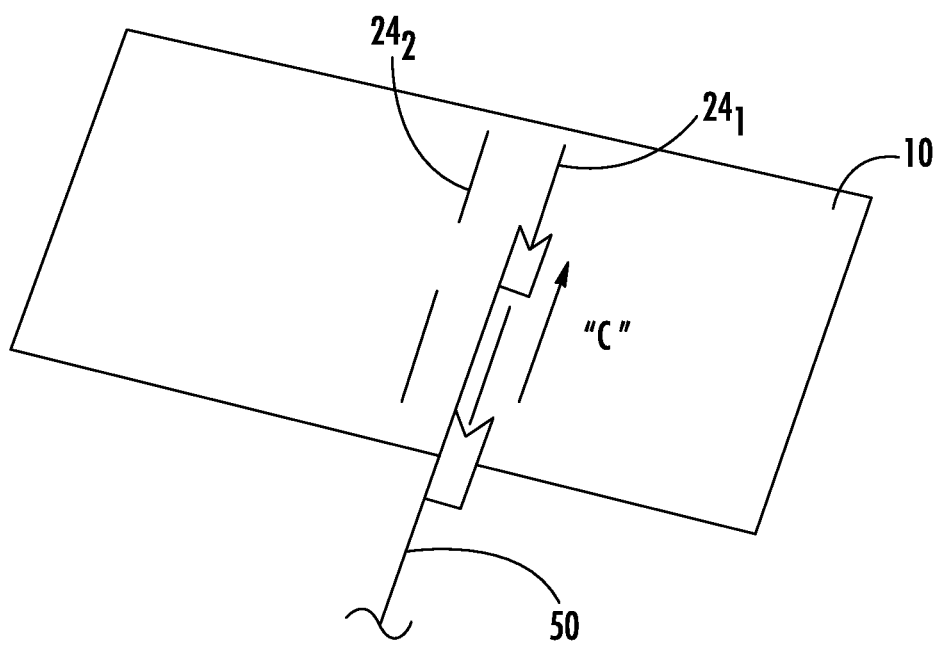
Figure 7E:
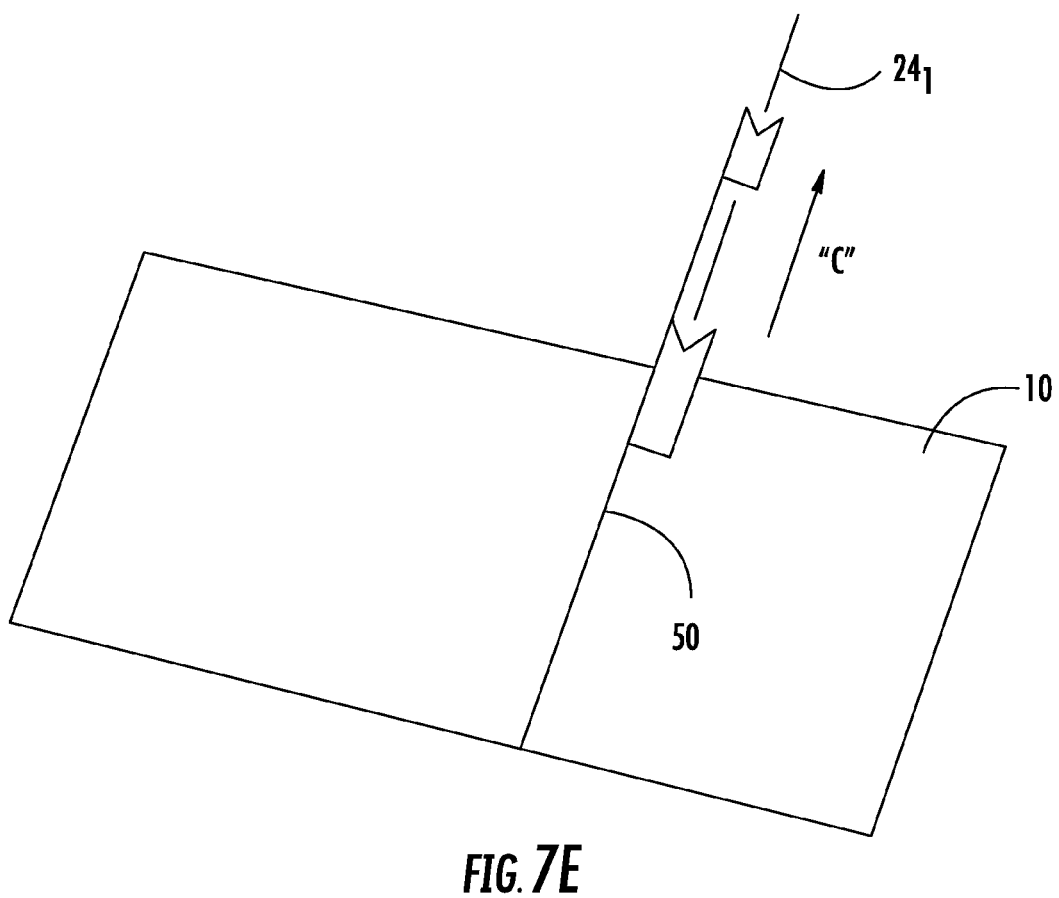

The lifter 50 continues moving in the direction of arrow "A" until the lifter protrusion 62 is placed adjacent the ID of the targeted substrate $24_1$. The lifter 50 is then moved laterally in the direction of arrow "B" (FIG. 7C) so that the lifter notch 66 and the alignment notch 72 are positioned just beneath the ID and OD of the substrate $24_1$, respectively. The lifter 50 is then moved upward in the direction of arrow "C" (again, along angle α) so that the lifter notch 66 engages the substrate ID and the stabilizer notch 72 captures the substrate OD, as shown in FIG. 7D. The lifter 50 continues its movement (again, in the direction of arrow "C") until the substrate $24_1$ is lifted up and out of the cassette 10 (see FIG. 7E). Once the substrate clears the cassette 10 it can then be removed from the lifter 50 and placed in another container (e.g., a FOUP) where it can proceed for further processing.

The lifter 50 may then retract in the reverse direction through the cassette 10, where it can be positioned to engage and remove another substrate from the cassette. This process can be repeated to remove a desired number of substrates from the cassette.

In one embodiment, once the lifter is returned to its original position beneath the cassette 10, the cassette is indexed to present a next substrate for engagement by the lifter 50. In another embodiment, the cassette 10 is stationary and the lifter 50 adjusts its position to engage a next substrate in the cassette 10. In still other embodiments both the cassette and the lifter move.

Figure 8:
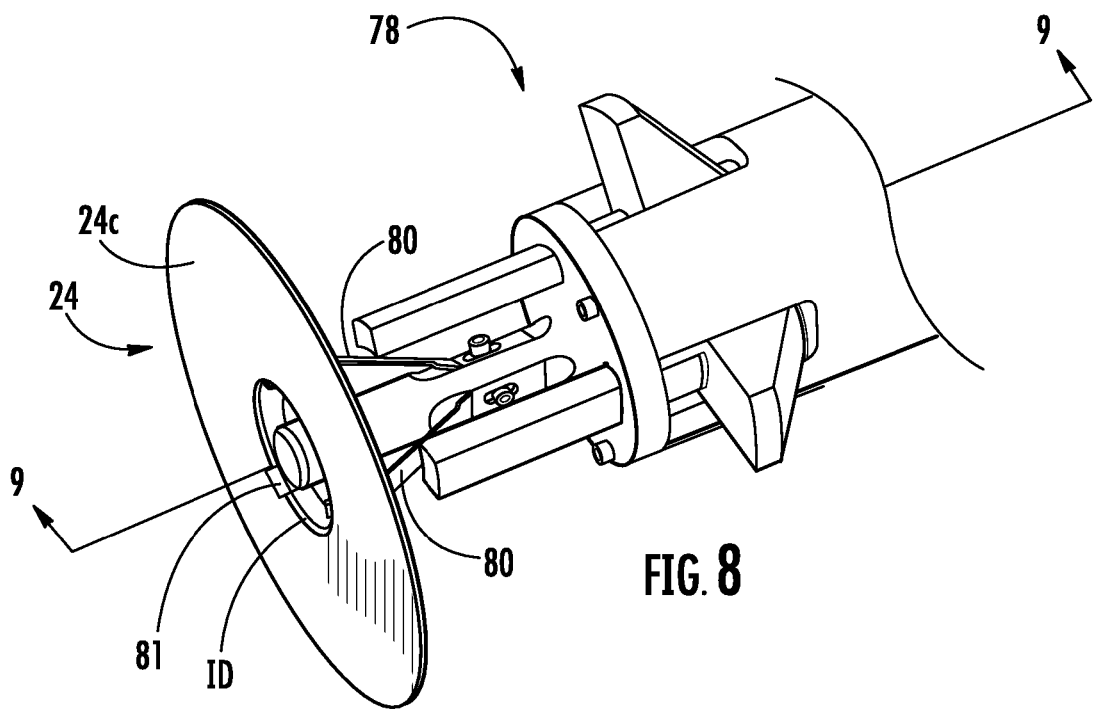
FIG. 8 is a perspective view of an exemplary substrate holder for use with the lifter of FIG. 3.

Referring now to FIG. 8, an exemplary holder 78 is shown for use in removing a substrate 24 from the lifter 50 and for transferring the substrate 24 to a FOUP or other container. As will be explained, the lifter 50 and holder 78 may have a series of complementary features that enable the holder 78 to precisely align with a substrate engaged on the lifter 50. As with the lifter 50, the holder 78 may engage the substrate on the ID so that positive engagement of the substrate is ensured, which contact with the substrate faces 24c, d is avoided. Thus, the holder 78 may include a plurality of substrate supports 80 positioned evenly about an alignment shaft 82. The substrate supports 80 and alignment shaft 82 can be inserted through the ID of the substrate 24 in a retracted configuration, and then adjusted to an expanded configuration in which the supports 80 engage the inner edge 24a of the substrate 24 (see FIG. 9). Distal portions 81 of the substrate supports 80 may have a cup-shape so that they positively retain the ID of the substrate 24 when the holder is in the expanded configuration. Once the substrate supports 80 are fully engaged with the substrate 24, the substrate can be removed from the lifter 50 simply by moving the substrate out of engagement with the lifter and stabilizer notches 66, 72.

Figure 9:
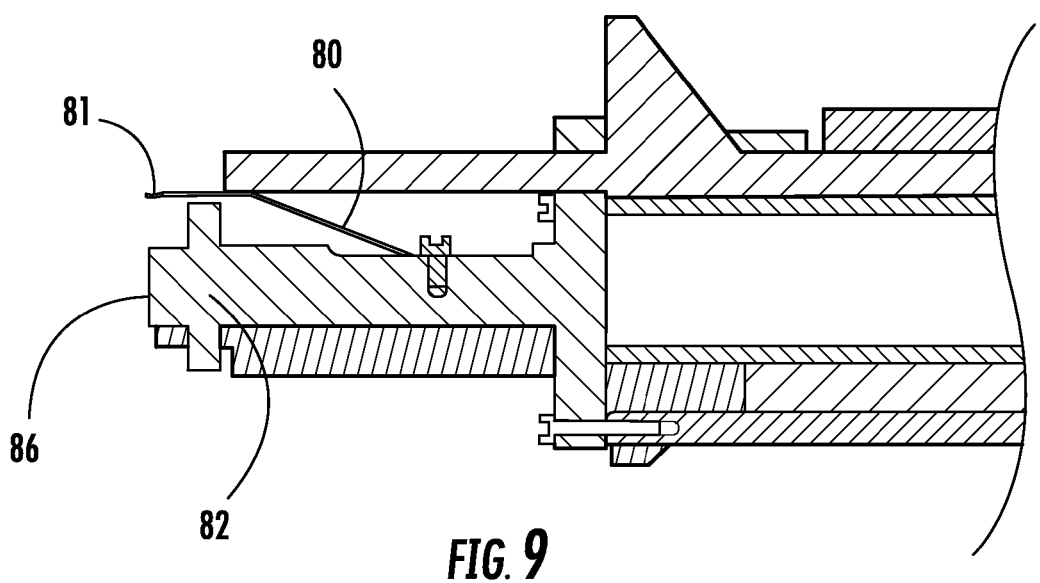
FIG. 9 is a cross-section view of the holder of FIG. 8, taken alone line 9-9 of FIG. 8.

FIG. 8 shows the holder 78 fully engaged with the substrate 24 (i.e., in the expanded configuration). FIG. 9 shows the holder 78 in the refracted configuration. The holder 78 can be adjusted between the retracted and expanded configurations manually or automatically. An example of the disclosed holder 78 is disclosed in related U.S. Pat. No. 8,550,520, the entirety of which is incorporated herein by reference.

Figure 10:
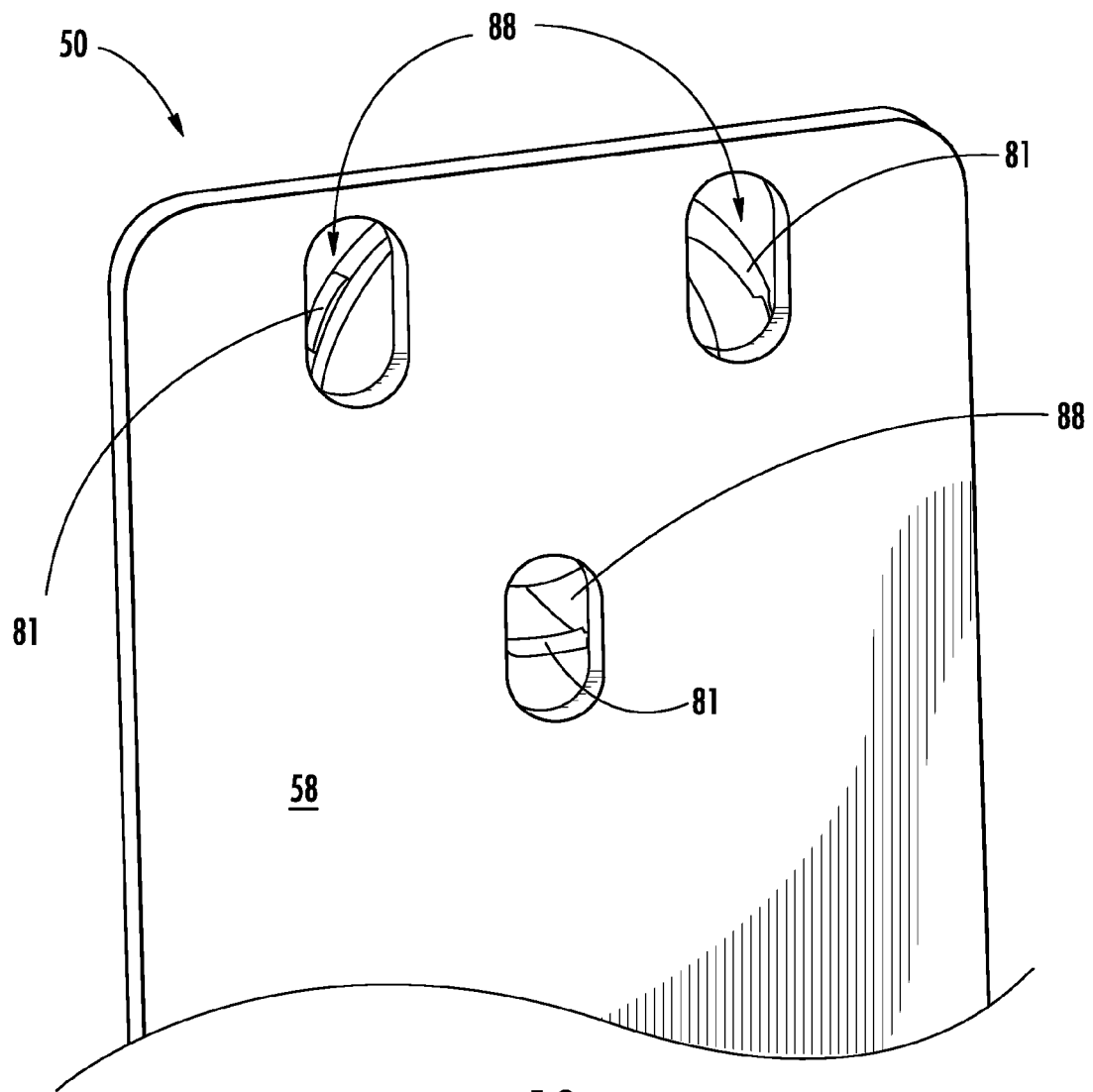
FIG. 10 is a reverse-perspective view of the lifter of FIG. 3.

As previously noted, the holder 78 and lifter 50 may have complementary features to enable the holder 78 to align precisely with a substrate 24 held by the lifter 50. These complementary features ensure a smooth handoff of the substrate 24 from the lifter 50 to the holder 78, minimizing the chance for damage to the substrate. Thus, referring to FIG. 3, the lifter 50 may include a nose slot 84 adjacent to the lifter notch 66 which is configured to receive a nose portion 86 of the alignment shaft 82 of the holder 78. In addition, the lifter 50 may have a plurality of support slots 88 configured to receive distal portions 81 of the substrate supports 80. These features enable the holder 78 to positively engage the lifter 50 to ensure proper repeatable alignment of the holder 78 with the substrate 24. FIG. 10 is a reverse perspective view of the support slots 88 in lifter 50 showing the distal portions 81 of the substrate supports 80 disposed in the slots 88 when the holder 78 is engaged with the lifter 50. In the illustrated embodiment, the holder 78 includes three substrate supports 80 and a single nose portion 78. It will be appreciated, however, that other alignment configurations can also be used. For example, fewer or greater numbers of substrate supports can be used.

Figure 11:
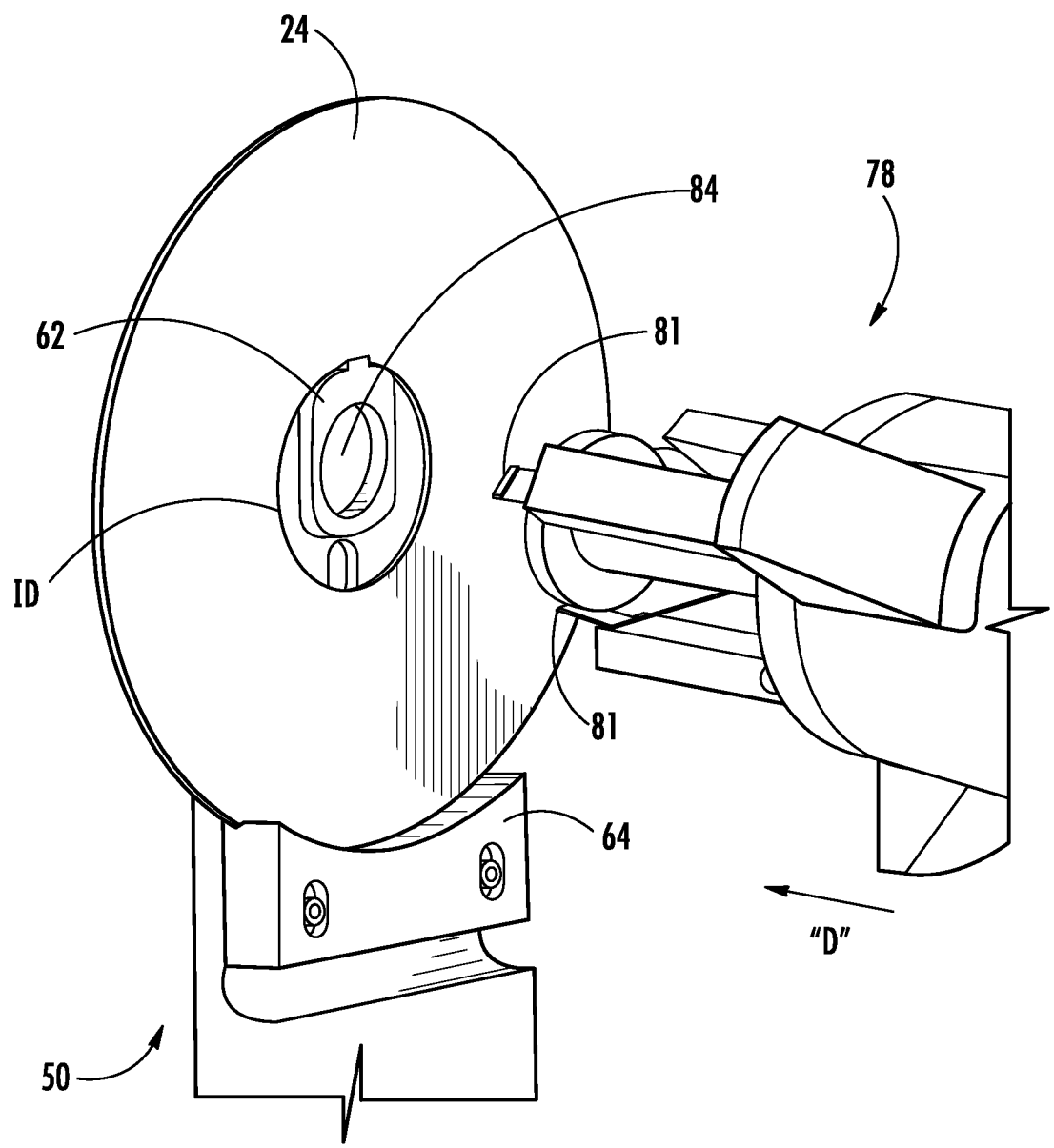
FIGS. 11-15 are a series of perspective views illustrating an exemplary operation of the substrate holder of FIG. 8 removing a substrate from the lifter of FIG. 3.
Figure 12:
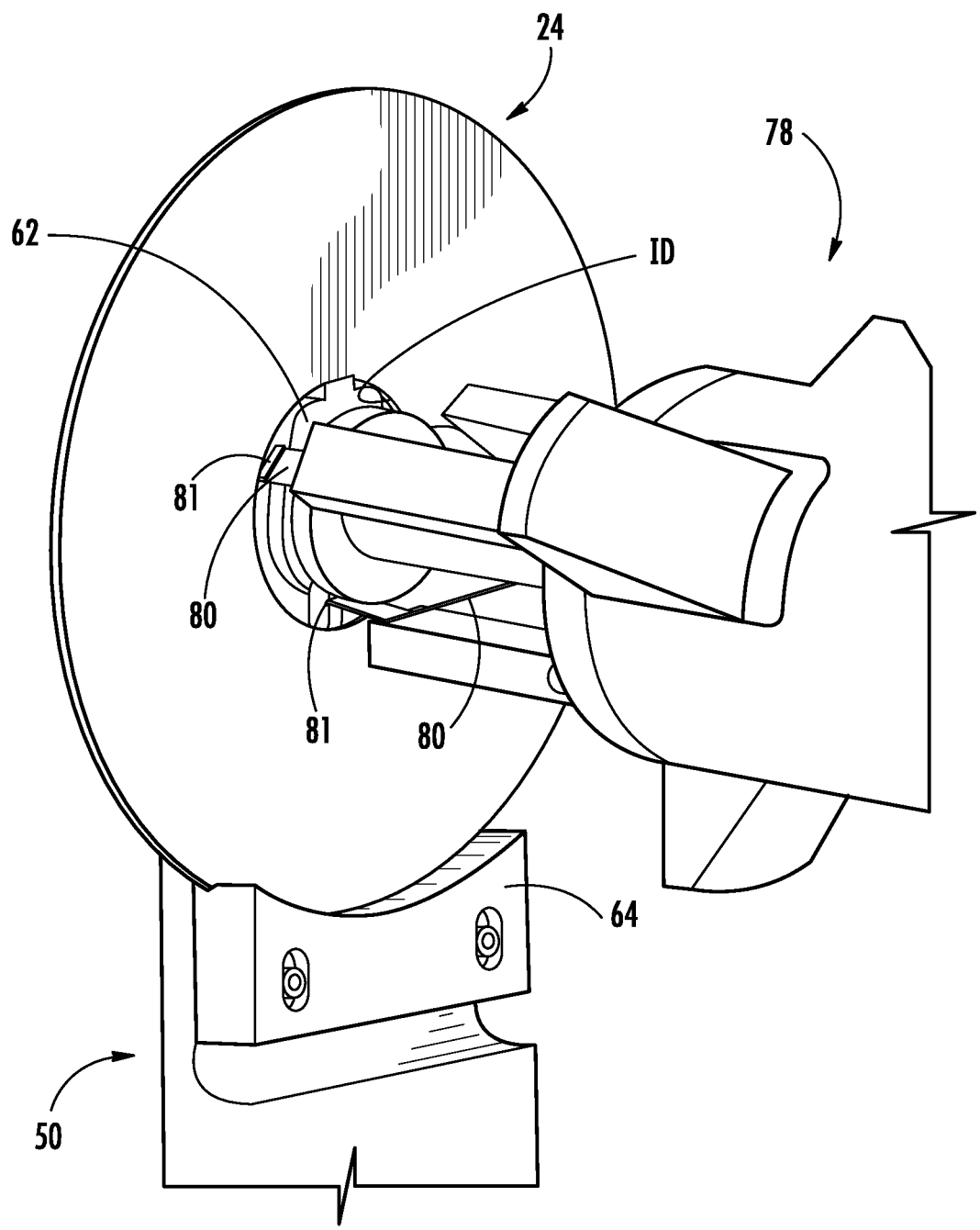
Figure 13:
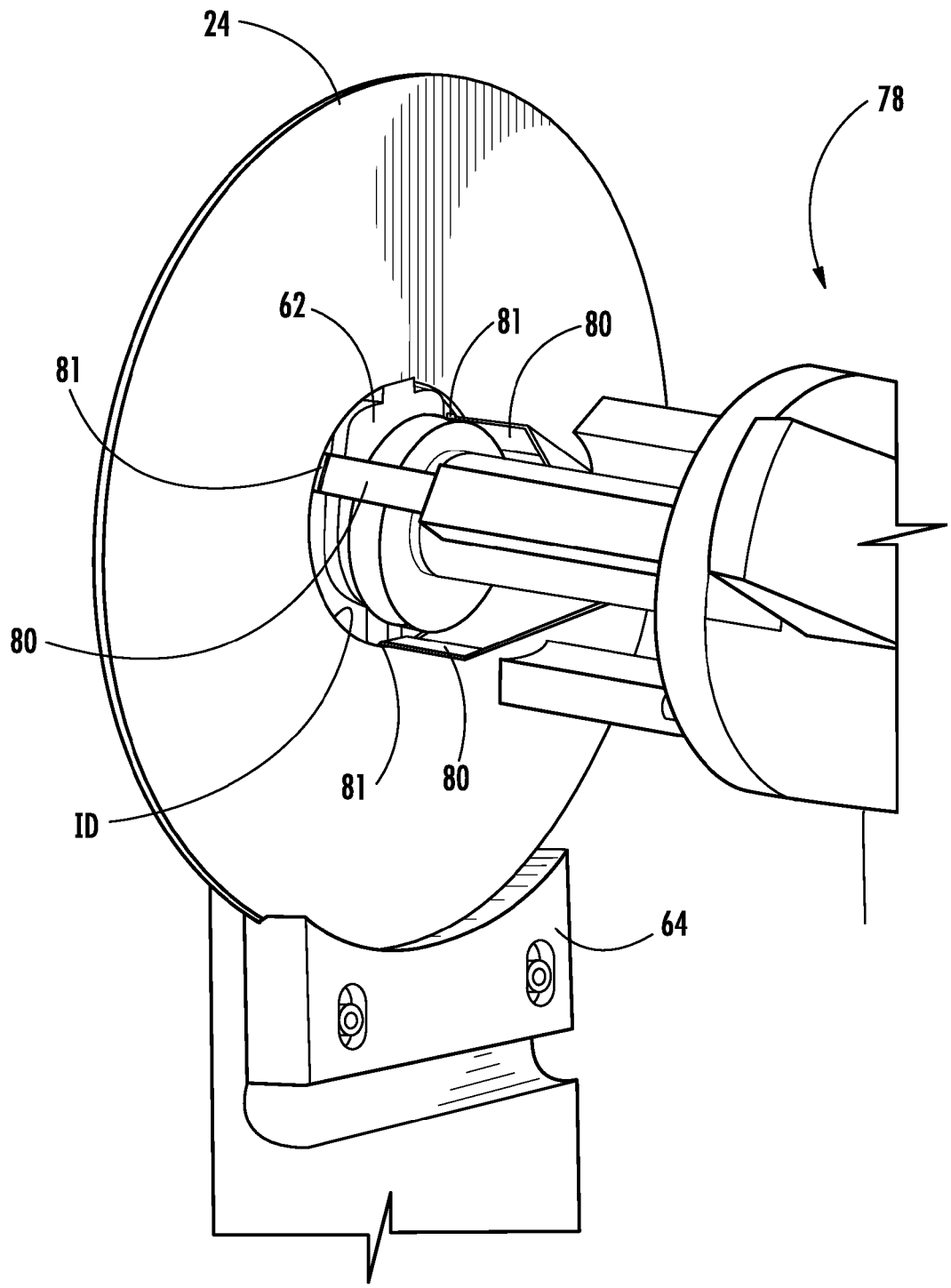
Figure 14:
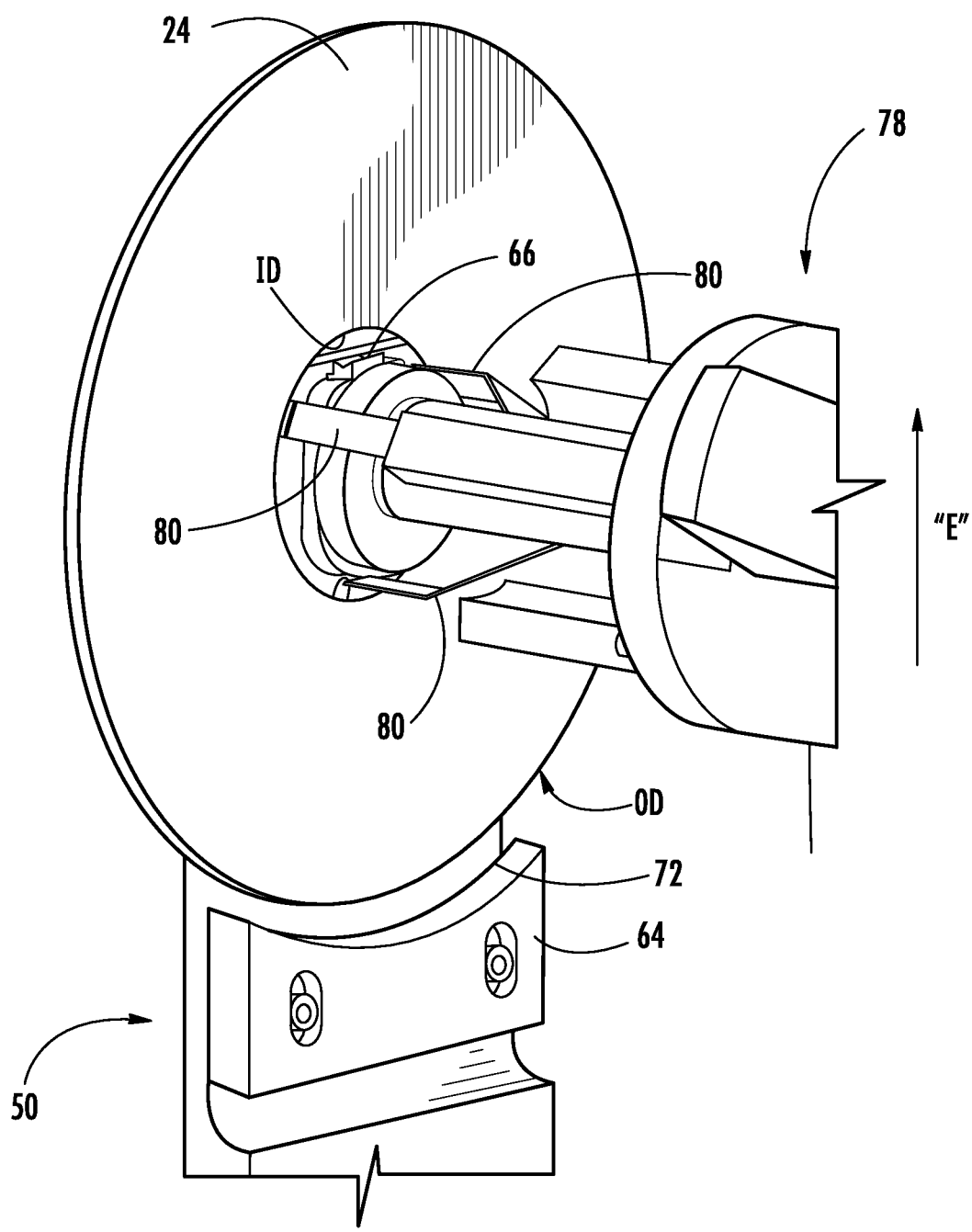
Figure 15:
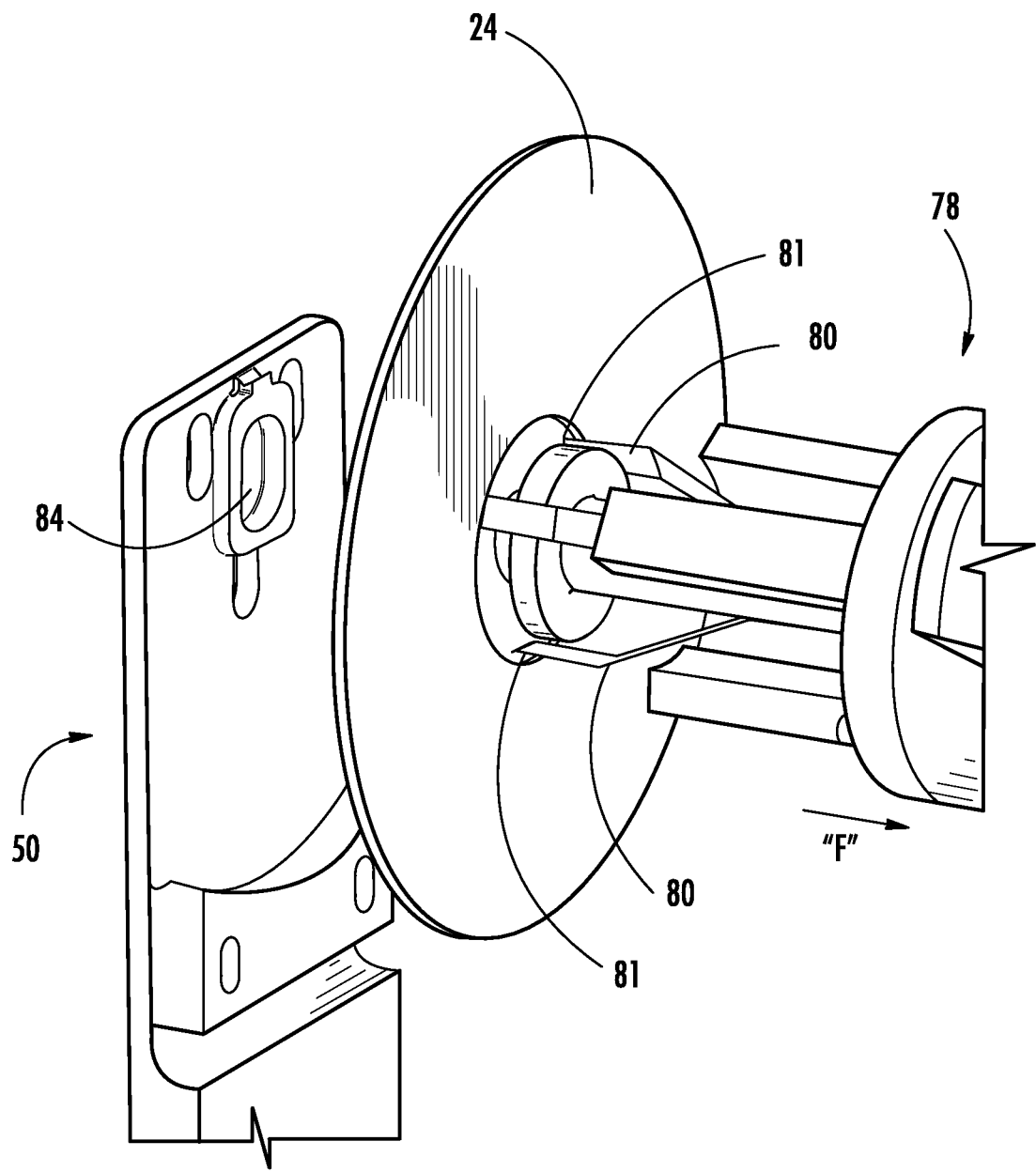

In operation, the holder 78 may be moved in the direction of arrow "D" (see FIG. 11) so that it is positioned adjacent to the lifter 50, which is engaged with the substrate 24. In this position, the holder 78 is in the retracted configuration so that the distal portions 81 of the substrate supports 80 can be received within the ID of the substrate 24. FIG. 12 shows the holder 78 engaged with the lifter 50 such that the nose portion 86 (see FIG. 9) and distal portions 81 are received in the nose slot 84 and support slots 88 (see FIG. 10) of the lifter 50. In this position, the distal portions 81 of the substrate supports 80 are positioned directly adjacent to the ID of the substrate 24. The holder 78 may then be adjusted to the expanded configuration so that the distal portions 81 of the substrate supports engage the ID of the substrate (see FIG. 13). At this point, the holder 78 may be moved upward in the direction of arrow "E" (see FIG. 14) so that the nose portion 86 of the holder 78 slides upward within the nose slot 84 and the distal portions 81 of the substrate supports slide upward within the support slots 88 of the lifter. This upward movement continues until the substrate ID clears the lifter notch 66 and the substrate OD clears the stabilizer notch 72, disengaging the substrate from the lifter 50. The holder 78 and substrate 24 may then be moved away from the lifter 50 in the direction of arrow "F" (see FIG. 15), so that the substrate 24 can be transported to a next process location (e.g., FOUP, etc.)

The lifter 50 and its components can be constructed from any of a variety of materials, including metals, polymers and combinations thereof. In some embodiments, a non-marring material rated to the flammability standards of UL 94-V0 may be used. In one exemplary embodiment, the lifter 50 may be constructed of polyetheretherketone (PEEK).

Figure 16:
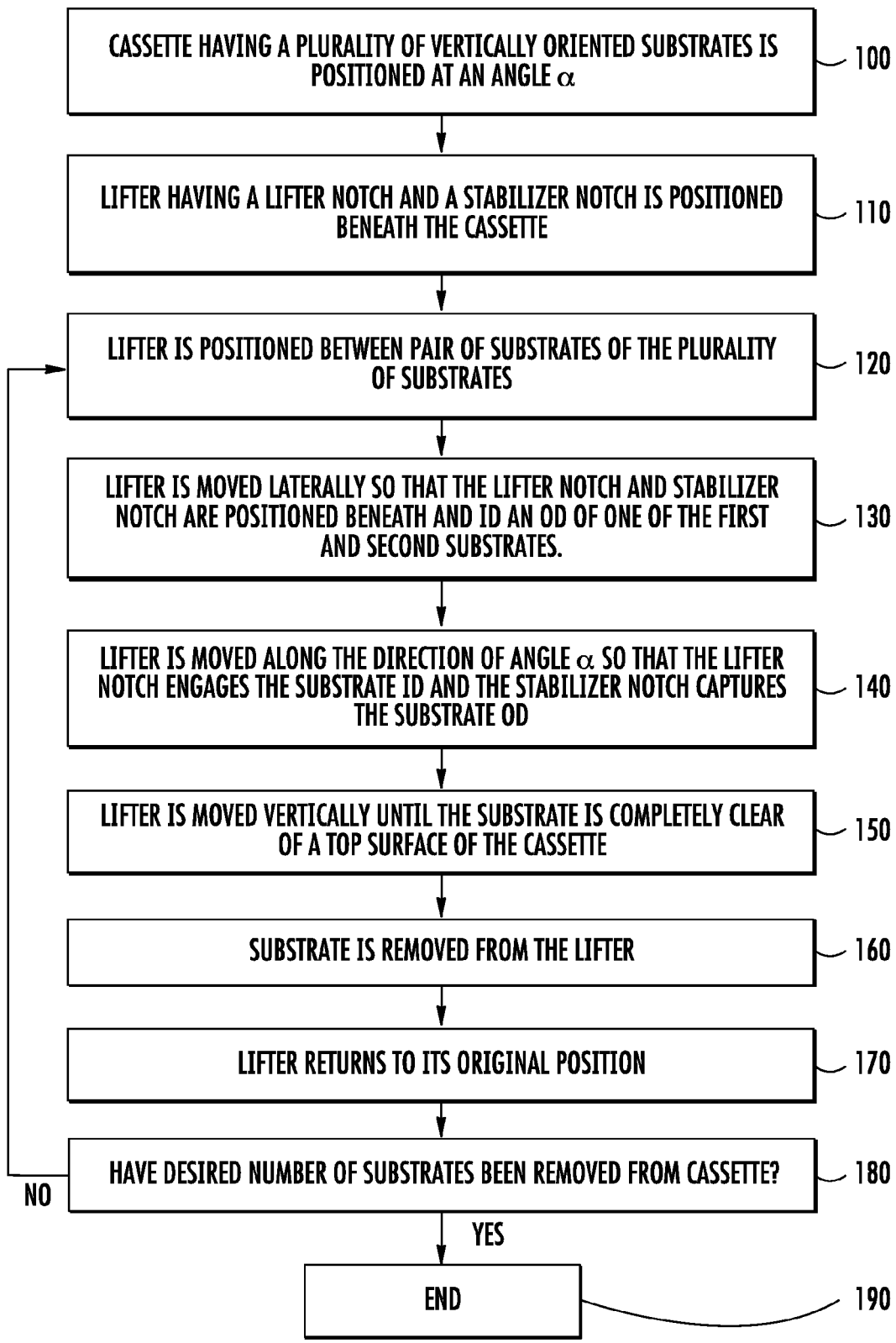
FIG. 16 is an exemplary logic flow illustrating a method according to the disclosure.

An exemplary logic flow will now be described in relation to FIG. 16. At step 100, a cassette 10 having a plurality of vertically oriented substrates 24 is positioned at an angle α. In one embodiment, α is less than about 5 degrees. At step 110, a lifter 50 having a lifter notch 66 and a stabilizer notch 72 is positioned beneath the cassette. At step 120, the lifter 50 is positioned between first and second substrates of the plurality of substrates. At step 130, the lifter is moved laterally so that the lifter notch 66 and stabilizer notch are positioned beneath an ID and OD of one of the first and second substrates. At step 140, the lifter is moved along the direction of angle α so that the lifter notch 66 engages the substrate ID and the stabilizer notch captures the substrate OD. At step 150, the lifter is moved vertically until the substrate is completely clear of a top surface of the cassette 10. At step 160, the substrate is removed from the lifter. At step 170, the lifter returns to the position of step 110. At step 180 a determination is made whether a desired number of substrates have been removed from the cassette 10. If the answer is yes, then at step 190 the method ends. If the answer is no, then the process returns to step 120.

Some embodiments of the disclosed device may be implemented, for example, using a storage medium, a computer-readable medium or an article of manufacture which may store an instruction or a set of instructions that, if executed by a machine, may cause the machine to perform a method and/or operations in accordance with embodiments of the disclosure. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory (including non-transitory memory), removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A substrate lifter for lifting a substrate having an outside diameter (OD), and inside diameter (ID), and first and second substrate faces, comprising:
  first and second ends, and first and second lifter faces;
  the first end comprising substrate engaging features including first and second recesses, the first recess positioned adjacent the first end of the lifter and configured to engage the substrate ID for lifting the substrate in a vertical direction, the second recess configured to receive the substrate OD for limiting lateral movement of the OD to a predetermined amount;
  wherein the substrate engaging features are fixedly spaced apart on the first and second lifter faces, respectively, when the first recess engages and the second recess receives the substrate;

wherein contact points of the first and second recesses that engage the substrate are oriented toward the first end of the lifter; and wherein the first recess is disposed in a lifter protrusion, the lifter protrusion having a centrally positioned slot for receiving an alignment surface of a substrate holder to align the substrate holder with the substrate.

2. The substrate lifter of claim 1, wherein the first recess comprises a lifter notch having angled lifter notch surfaces, the angled lifter notch surfaces for contacting an inner edge of the substrate, the inner edge of the substrate defined by the ID of the substrate, and wherein the second recess comprises a stabilizer notch having angled stabilizer notch surfaces, the angled stabilizer notch surfaces for contacting an outer edge of the substrate, the outer edge of the substrate defined by the OD of the substrate.

3. The substrate lifter of claim 1, wherein the first recess is disposed in a lifter protrusion and the second recess is disposed in a stabilizer portion, the stabilizer portion being selectively adjustable with respect to the first lifter face to adjust a distance between the lifter protrusion and the stabilizer portion to enable the lifter to engage substrates of different sizes.

4. The substrate lifter of claim 1, wherein the second recess comprises a stabilizer notch having angled stabilizer notch surfaces disposed in a stabilizer portion, the angled stabilizer notch surfaces configured to prevent the first and second substrate faces from contacting the substrate lifter.

5. The substrate lifter of claim 1, wherein the first end of the lifter includes a plurality of openings disposed about the lifter protrusion, the plurality of openings for receiving a plurality of substrate supports of the substrate holder when the alignment surface of the substrate holder is received in the centrally positioned slot of the lifter protrusion.

6. The substrate lifter of claim 1, wherein the substrate lifter has a lifter thickness defined between the first and second lifter faces, and a lifter width defined between first and second side surfaces of the substrate lifter, and wherein the lifter thickness is less than ¼ inch to enable the lifter to move between first and second substrates in a substrate cassette, and wherein the lifter width is less than the substrate OD to enable the lifter to be received through a first opening in the substrate cassette.

7. The substrate lifter of claim 1, further comprising an automatic adjustment assembly coupled to the second end of the substrate lifter, the automatic adjustment assembly for positioning the lifter to sequentially remove individual vertically oriented substrates from a substrate cassette, the assembly for inserting the lifter into the substrate cassette at a first end of the cassette, moving the substrate engaging features into engagement with the ID of a selected one of the vertically oriented substrates, and lifting the selected one of the vertically oriented substrates out of the substrate cassette at a second end of the cassette.

8. The substrate lifter of claim 1, further comprising:
a generally planer surface formed by the first and second lifter faces;
wherein substrate engaging features are disposed on the generally planar surface such that they are fixed relative to the generally planar surface.

9. A substrate lifter for selectively removing a vertically oriented substrate from a substrate cassette, the vertically oriented substrate having an inside diameter (ID), an outside diameter (OD), the substrate lifter comprising:
a substrate engaging end and an adjustment end;
the substrate engaging end comprising a lifter notch and a stabilizer notch, the lifter notch configured to engage the substrate ID to lift the substrate vertically, the stabilizer notch having first and second angled notch surfaces, the stabilizer notch positioned to contact the substrate OD with the first angled notch surface or the second angled notch surface to prevent a face of the substrate from contacting the substrate lifter;
wherein the lifter notch includes angled lifter notch surfaces, and substrate contact points of the lifter notch and the stabilizer notch are oriented toward the engaging end;
wherein the lifter and stabilizer notches are fixedly spaced apart on a common lifter face when the lifter notch engages and the stabilizer notch contacts the substrate;
wherein the substrate lifter has a thickness defined between front and back lifter surfaces, and a width defined between first and second lifter sides, the lifter width being smaller than the substrate OD; and
wherein the lifter notch is disposed in a lifter protrusion, the lifter protrusion having a centrally positioned slot for receiving an alignment protrusion of a substrate holder to align the substrate holder with the substrate.

10. The substrate lifter of claim 9, wherein the lifter notch is disposed in a lifter protrusion and the stabilizer notch is disposed in a stabilizer portion, the stabilizer portion being selectively adjustable with respect to a face of the lifter to adjust a distance between the lifter protrusion and the stabilizer portion to enable the lifter to engage substrates of different sizes.

11. The substrate lifter of claim 9, wherein the substrate engaging end of the lifter includes a plurality of openings disposed about the lifter protrusion, the plurality of openings for receiving a plurality of substrate supports of the substrate holder when the alignment protrusion of the substrate holder is received in the centrally positioned slot of the lifter protrusion.

12. A method for removing a vertically oriented substrate from a cassette, comprising:
positioning a lifter having a lifter notch and a stabilizer notch beneath a cassette containing a plurality of vertically oriented substrates, the lifter notch and the stabilizer notch each having first and second angled notch surfaces for engaging the substrate, such first and second angled notch surfaces oriented toward a first end of the lifter, substrate contact points of the first and second angled notch surfaces oriented in the same direction;
engaging the lifter notch with an inside diameter (ID) of a targeted substrate of the plurality of vertically oriented substrates;
capturing an outside diameter (OD) of the targeted substrate with the stabilizer notch such that the OD contacts only the first angled stabilizer notch surface or the second angled stabilizer notch surface;
wherein the lifter and stabilizer notches are fixedly spaced apart on a common lifter face when the lifter notch engages and the stabilizer notches captures the substrate;
moving the lifter and the substrate in a first direction until the targeted substrate is removed from the cassette;
engaging a substrate holder with the lifter, the substrate holder having an alignment protrusion and a plurality of substrate supports, and the lifter having a plurality of corresponding alignment slots for receiving the alignment protrusion and the plurality of substrate supports; and
engaging the targeted substrate with the substrate holder, and removing the targeted substrate from the lifter.

13. The method of claim 12, further comprising tilting the cassette by a tilt angle less than about 5 degrees prior to the step of engaging the lifter notch with the ID of the targeted substrate, wherein the first direction is aligned with the tilt angle.

14. The method of claim 13, further comprising, after the targeted substrate is removed from the cassette, returning the lifter to its position beneath the cassette, and repeating the moving steps to remove another targeted substrate from the cassette.

15. The method of claim 12, wherein the engaging and capturing steps further comprise:
    moving the lifter in the first direction until the lifter notch is positioned laterally adjacent to the substrate ID and the stabilizer notch is positioned laterally adjacent to the substrate OD;
    moving the lifter in a second direction until the lifter notch is positioned beneath the substrate ID and the stabilizer notch is positioned beneath the substrate OD; and
moving the lifter in the first direction until the lifter notch engages the substrate ID and the stabilizer notch captures the substrate OD.

16. The method of claim 12, wherein:
    the movement of the lifter is automatically controlled by an adjustment assembly including an automated adjustment mechanism; and
    the automated adjustment mechanism includes at least one servo motor or stepper motor.

\* \* \* \* \*